(12) United States Patent
Kobayashi

(10) Patent No.: US 10,742,162 B2
(45) Date of Patent: Aug. 11, 2020

(54) FIXING STRUCTURE OF SOLAR CELL MODULE

(71) Applicant: Yanegijutsukenkyujo Co., Ltd., Takahama-shi, Aichi (JP)

(72) Inventor: Shuichi Kobayashi, Takahama (JP)

(73) Assignee: Yanegijutsukenkyujo Co., Ltd., Takahama-shi, Aichi (JP)

(*) Notice: Subject to any disclaimer, the term of this patent is extended or adjusted under 35 U.S.C. 154(b) by 0 days.

(21) Appl. No.: 16/353,285

(22) Filed: Mar. 14, 2019

(65) Prior Publication Data

US 2019/0207551 A1 Jul. 4, 2019

Related U.S. Application Data

(63) Continuation of application No. PCT/JP2016/078852, filed on Sep. 29, 2016.

(51) Int. Cl.
*H02S 30/10* (2014.01)
*H01L 31/042* (2014.01)
(Continued)

(52) U.S. Cl.
CPC ............ *H02S 30/10* (2014.12); *H01L 31/042* (2013.01); *H02S 20/23* (2014.12); *H02S 30/00* (2013.01); *Y02B 10/12* (2013.01)

(58) Field of Classification Search
CPC .......... H02S 20/23; H02S 30/10; H02S 30/00; H01L 31/042; Y02B 10/12; Y02B 10/20;
(Continued)

(56) References Cited

U.S. PATENT DOCUMENTS 8,273,981 B2 * 9/2012 Kobayashi ............... H02S 20/23
136/251
8,404,963 B2 * 3/2013 Kobayashi ............ F24S 25/615
136/244
(Continued)

FOREIGN PATENT DOCUMENTS

JP 2007165499 A 6/2007
JP 4365450 B1 11/2009
JP 201259747 A 3/2012

OTHER PUBLICATIONS

International Search Report (in English and in Japanese) for International Patent Application No. PCT/JP2016/078852 dated Nov. 22, 2016.

*Primary Examiner* — Jessie T Fonseca
(74) *Attorney, Agent, or Firm* — Ken ichiro Yoshida

(57) ABSTRACT

Provided is a solar cell module securing structure in which a first extending portion of one securing tool is inserted into a slit of one of the adjacent solar cell modules and a second extending portion of the same securing tool is inserted into a slit of the other of the adjacent solar cell modules, lower abutting surfaces of both of the solar cell modules are installed on an upper surface portion of the same securing tool, a projecting portion projects from the upper surface portion under the second extending portion at the inner side relative to the lower abutting surface, and a distance between the projecting portion and an end of the second extending portion is set to be larger than a distance between a lower end of an opening edge of the slit and the lower abutting surface.

2 Claims, 7 Drawing Sheets

(51) Int. Cl.
*H02S 20/23* (2014.01)
*H02S 30/00* (2014.01)

(58) Field of Classification Search
CPC ......... F24S 2025/6007; F24S 2025/801; F24S 25/20; F24S 2025/6004; F24S 25/61; F24S 25/65; F24S 2025/6002; F24S 25/67; Y02E 10/47
See application file for complete search history.

(56) References Cited

U.S. PATENT DOCUMENTS

| | | | |
|---|---|---|---|
| 9,951,972 B2* | 4/2018 | Miyamoto | H02S 30/00 |
| 2007/0131273 A1 | 6/2007 | Kobayashi | |
| 2010/0154199 A1 | 6/2010 | Kobayashi | |
| 2010/0155547 A1 | 6/2010 | Kobayashi | |
| 2011/0047903 A1 | 3/2011 | Kobayashi | |
| 2012/0180406 A1* | 7/2012 | Kobayashi | F24S 25/615 52/173.3 |
| 2013/0104471 A1* | 5/2013 | Kobayashi | H02S 20/23 52/173.3 |
| 2013/0340811 A1* | 12/2013 | Danning | F24S 25/61 136/251 |
| 2016/0111996 A1* | 4/2016 | Stephan | F16B 5/0028 248/316.6 |
| 2017/0194902 A1* | 7/2017 | Meine | H02S 20/23 |

\* cited by examiner

FIXING STRUCTURE OF SOLAR CELL MODULE

BACKGROUND OF THE INVENTION

Field of the Invention

The present invention relates to a solar cell module securing structure for securing solar cell modules onto an installation face such as a roof face using securing tools.

Description of the Related Art

The present applicant has proposed in the past a structure using securing tools that are mounted on frames in a sliding manner as a securing structure for securing, onto an installation face, a solar cell module formed by holding a peripheral edge of a solar cell panel by frames using securing tools (see, Japanese Patent Application Laid-open No. 2007-165499 and Japanese Patent No. 4365450, for example). In this securing structure, one pair of frames of two pairs of frames holding the solar cell panel having a square shape respectively has slits extending in the lengthwise direction in side surfaces portions thereof, and the securing tools have portions that are inserted into the slits.

With the securing structure, mounting positions of the securing tools can be determined by causing the securing tools to slide along the slits of the frames without requiring an operation of previously positioning and securing the securing tools on the installation face in accordance with a mounting pitch of the securing tools on the solar cell module. Further, because the positions of the securing tools can be easily adjusted by causing the securing tools to slide along the slits of the frames, fastening members such as screws and nails for securing the securing tools onto a roof face can be easily adjusted so as to be driven into a structural member such as a balk supporting the roof. Accordingly, the solar cell module can be supported on the structural member using the securing tools, thereby providing the solar cell module securing structure with high strength.

In addition, the portions of the securing tools, which are inserted into the slits, can be inserted into the slits from the lateral direction orthogonal to the direction in which the slits extend. Therefore, the solar cell modules can be secured onto the installation face in order in one direction. For example, when an inclined roof face is the installation face, the solar cell modules can be secured onto it in order in one direction toward ridge from eaves.

However, the conventional techniques have the following problem in the operation of securing the solar cell module onto the installation face. That is to say, at a stage at which one frame of the pair of frames of one solar cell module has been secured onto the installation face with the securing tool but the other frame has not been secured onto the installation face with the securing tool yet, the solar cell module moves not only in the direction in which the slits extend but also in the direction orthogonal thereto during the operation in some cases. For this reason, the solar cell module is detached from the securing tool that has been secured onto the installation face and it becomes difficult to perform the operation of securing the solar cell module in some cases.

[Patent Document 1] Japanese Patent Application Laid-open No. 2007-165499

[Patent Document 2] Japanese Patent No. 4365450

SUMMARY OF THE INVENTION

The present invention has been made in view of the above-mentioned circumstances, an object thereof is to provide a solar cell module securing structure that enables an operation of securing solar cell modules onto an installation face using securing tools to be performed more easily.

In order to achieve the above-described object, a solar cell module securing structure (hereinafter, simply referred to as a "securing structure") according to an aspect of the present invention is "a solar cell module securing structure in which solar cell modules each formed by holding one pair of sides of two pairs of sides of a square solar cell panel on one pair of first frames are secured onto an installation face using a securing tool, wherein each of the first frames includes:
  an upper abutting surface that abuts against an upper surface of the solar cell panel;
  a side surface portion that extends downward from one end of the upper abutting surface at right angles;
  an installing surface that extends in parallel to the upper abutting surface from an intermediate height of the side surface portion and holds the solar cell panel between the installing surface and the upper abutting surface while the solar cell panel is installed on the installing surface;
  a slit that is opened in the side surface portion at an intermediate height thereof and extends in a lengthwise direction of the first frame under the installing surface; and
  a lower abutting surface that extends in parallel to the upper abutting surface from a lower end of the side surface portion, the securing tool includes:
  a base portion that is secured onto the installation face;
  a standing wall portion that extends upward from an upper surface portion of the base portion and extends in a lengthwise direction of the first frame;
  a side extending portion that is formed by a first extending portion and a second extending portion extending from an upper end of the standing wall portion in both directions orthogonal to the lengthwise direction; and
  a projecting portion that projects from the upper surface portion of the base portion at a position separated from the standing wall portion in the same direction as the second extending portion, the lower abutting surfaces of the solar cell modules, which are adjacent to each other, are installed on the upper surface portion of one securing tool in a state in which the first extending portion of the same securing tool is inserted into the slit of one of the adjacent solar cell modules and the second extending portion of the same securing tool is inserted into the slit of the other of the adjacent solar cell modules, a distance between the projecting portion and an end of the second extending portion is larger than a distance between a lower end of an opening edge of the slit and the lower abutting surface, and at least a part of the second extending portion is inserted into the slit in a state in which the projecting portion projects from the upper surface portion at an inner side relative to the lower abutting surface of which an entire surface abuts against the upper surface portion".

The "installation face" can be an inclined roof face or a horizontal roof face. In this case, roof can be slate roof, metal roof, or tile roof. The "installation face" is not limited to the roof face and may be an inclined face or a horizontal face exclusive for installing the solar cell module thereon.

With the securing structure having this configuration, the adjacent solar cell modules are secured onto the installation face with the securing tool arranged therebetween. That is to say, the adjacent solar cell modules are secured onto the installation face by securing the securing tool onto the installation face in the state in which the first extending portion of the securing tool is inserted into the slit of the first frame of one of the adjacent solar cell modules and the second extending portion of the same securing tool is inserted into the slit of the first frame of the other of the adjacent solar cell modules.

The projecting portion is formed on the upper surface portion of the securing tool at one side with respect to the standing wall portion, that is, on the upper surface portion at the side at which the second extending portion extends. With the securing structure having this configuration, the projecting portion projects from the upper surface portion at the inner side relative to the lower abutting surface in the state in which the entire surface of the lower abutting surface abuts against the upper surface portion. Accordingly, the first frame in the state of being installed on the upper surface portion of the securing tool can slide in the lengthwise direction but movement thereof in the direction orthogonal to the lengthwise direction is prevented by the projecting portion. In addition, at least a part of the second extending portion is inserted into the slit of the first frame in the state in which the entire surface of the lower abutting surface abuts against the upper surface portion and the projecting portion projects from the upper surface portion at the inner side relative to the lower abutting surface. Therefore, even when upward force acts on the first frame in the state of being installed on the upper surface portion of the securing tool, the slit and the second extending portion interfere with each other to inhibit the movement of the first frame. That is to say, with this configuration, both of the movement of the first frame in the direction orthogonal to the lengthwise direction and the upward movement thereof are prevented, in the state in which the first frame is installed on the upper surface portion of the securing tool.

Accordingly, when the solar cell modules are secured onto the installation face using the securing tools in order in one direction in which the second extending portions extend, relative detachment of the securing tools from the slits of the first frames due to undesired movement of the solar cell modules can be effectively prevented by the projecting portions. The securing structure can therefore be constructed with high workability.

Although the projecting portion projects from the upper surface portion of the securing tool, the distance between the projecting portion and an end of the second extending portion is set to be larger than the distance between the lower end of the opening edge of the slit and the lower abutting surface. Therefore, when the solar cell module is intentionally inclined so as to be higher in the direction in which the second extending portion extends, the first frame can be supported on the securing tool while the second extending portion of the securing tool is inserted into the slit of the first frame and the lower abutting portion of the first frame is installed on the upper surface portion of the securing tool.

In the solar cell module securing structure in the aspect of the present invention, in addition to the above-mentioned configuration, "each of the first frames has a connecting portion that connects the lower abutting surface and the installation surface at an inner side relative to the side surface portion, a first engaging piece that projects outward from the connecting portion under the slit, and a gap that is formed in the side surface portion and allows access from outward to the first engaging piece, the securing tool has a second engaging piece that projects in the same direction as the first extending portion from the standing wall portion under the first extending portion, and the first engaging piece is engaged with the second engaging piece in a state in which the first extending portion is inserted into the slit".

With the above-mentioned configuration, relative detachment of the first frame from the securing tool in the direction in which the slit is detached from the second extending portion is prevented. In addition, with this configuration, engagement between the first engaging piece of the first frame and the second engaging piece of the securing tool prevents relative detachment of the securing tool from the first frame in the direction in which the first extending portion is detached from the slit. Accordingly, undesired movement of the solar cell modules relative to the securing tool is prevented in both of the directions orthogonal to the lengthwise direction of the first frames. The solar cell modules can therefore be secured onto the installation face with higher workability.

As described above, as the effect of the present invention, the solar cell module securing structure that enables the operation of securing the solar cell modules onto the installation face using the securing tool to be performed more easily is provided.

DESCRIPTION OF THE EMBODIMENTS

Figure 1:
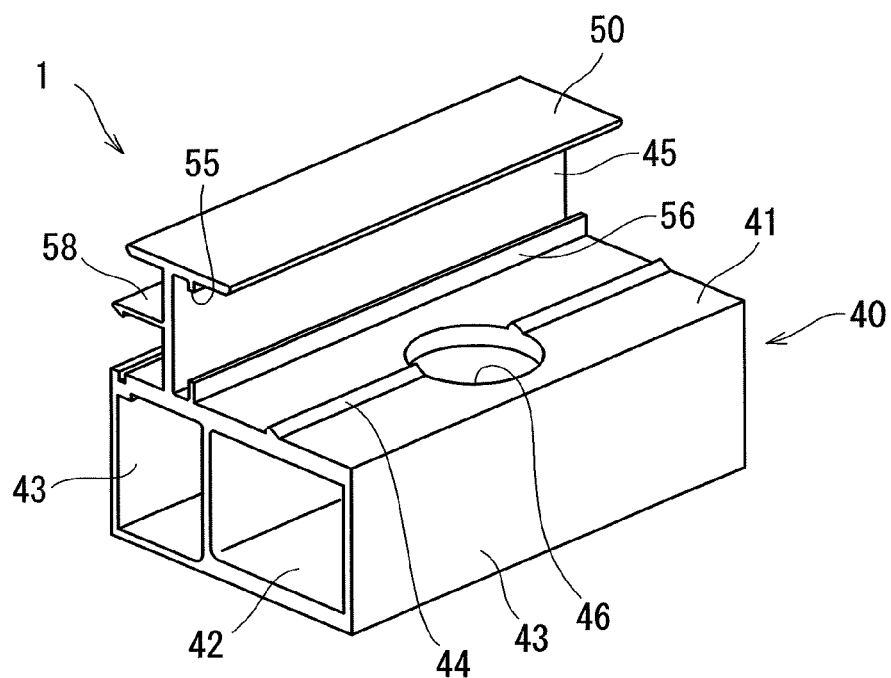
FIG. 1 is a perspective view of a securing tool that is used for a securing structure as an embodiment of the present invention.

Hereinafter, a solar cell module securing structure as an embodiment of the present invention will be described with reference to FIG. 1 to FIG. 9. In this embodiment, an inclined roof face is an installation face 5. An arrow F in each of several drawings indicates a downward direction of the installation face 5.

The securing structure in the embodiment secures, using a plurality of securing tools 1, a plurality of solar cell modules 10 in a plurality of rows in the inclination direction of the installation face 5 and a plurality of rows in the direction orthogonal to the inclination direction.

Each of the solar cell modules 10 includes a solar cell panel 19 having a rectangular shape when seen from above, a pair of first frames 11a and 11b holding a pair of long sides of the solar cell panel 19, and a pair of second frames 12 holding a pair of short sides of the solar cell panel 19. The pair of first frames 11a and 11b has shapes of cross sections orthogonal to the lengthwise direction, which are symmetric to each other with respect to the solar cell panel 19. The pair of first frames 11a and 11b is distinguished while the first frame at the eaves side is referred to as the first frame 11a and the first frame at the ridge side is referred to as the first frame 11b. The pair of second frames 12 also has shapes of cross sections orthogonal to the lengthwise direction, which are symmetric to each other with respect to the solar cell panel 19. It should be noted that the first frames 11a and 11b and the second frames 12 are extruded members made of metal such as aluminum and have constant cross-sectional shapes orthogonal to the lengthwise directions thereof.

Figure 3:
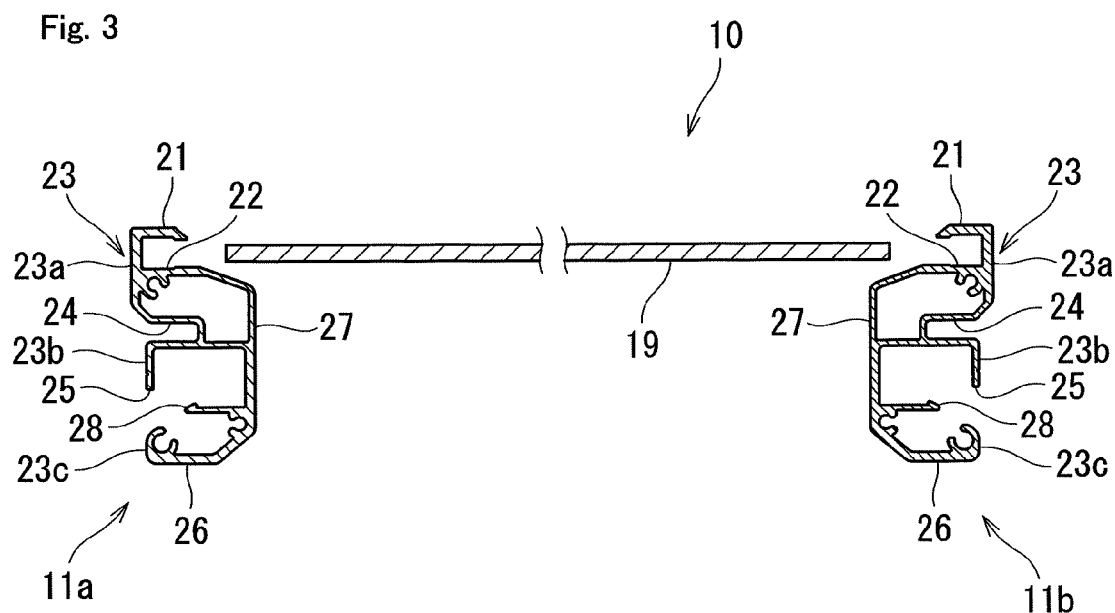
FIG. 3 is an exploded cross-sectional view of a solar cell module.

As mainly illustrated in FIG. 3, each of the first frames 11a and 11b includes an upper abutting surface 21 that abuts against the upper surface of the solar cell panel 19, a side surface portion 23 that extends downward from one end of the upper abutting surface 21 at right angles, an installing surface 22 that extends in parallel to the upper abutting surface 21 from an intermediate height of the side surface portion 23 and holds the solar cell panel 19 between it and the upper abutting surface 21 while the solar cell panel 19 is installed thereon, a slit 24 that is opened in the side surface portion 23 at a intermediate height lower than the installing surface 22 and extends in the lengthwise direction of the first frame 11a or 11b, a lower abutting surface 26 that extends in parallel to the upper abutting surface 21 from a lower end of the side surface portion 23, and a connecting portion 27 that connects the lower abutting surface 26 and the installing surface 22 at the inner side relative to the side surface portion 23. Further, each of the first frames 11a and 11b includes a first engaging piece 28 that projects outward from the connecting portion 27 at a height lower than the slit 24 and the front end of the first engaging piece 28 has a hook shape bent upward. A gap 25 that allows access from outward to the first engaging piece 28 is formed in the side surface portion 23 at substantially the same height as the first engaging piece 28.

Hereinafter, expressions "inner side" and "outer side/outward" indicate an "inner side" and an "outer side/outward" relative to a space surrounded by the pair of first frames 11a and 11b and the pair of second frames 12 in each solar cell module 10.

An upper portion of the side surface portion 23 relative to the slit 24 is referred to as a side surface upper portion 23a, a portion thereof between the slit 24 and the gap 25 is referred to as a side surface intermediate portion 23b, and a lower portion thereof relative to the gap 25 is referred to as a side surface lower portion 23c. In the embodiment, the side surface intermediate portion 23b is parallel to the side surface upper portion 23a but is not located on the same plane, and the side surface intermediate portion 23b is located at the inner side relative to the side surface upper portion 23a. On the other hand, the side surface lower portion 23c is located on the same plane as the side surface intermediate portion 23b. The connecting portion 27 is formed mainly by a portion parallel to the side surface portion 23, an upper portion thereof is inclined outward and reaches the installing surface 22, and a lower portion thereof is inclined outward and reaches the lower abutting surface 26.

The pair of second frames 12 can have the same configurations as those of the pair of first frames 11a and 11b. In this case, the number of components of the solar cell module 10 is reduced to provide a simple configuration and the pair of second frames 12 can be secured onto the installation face 5 using the securing tools 1. Alternatively, the second frames 12 can be configured on the premise that no securing tool 1 is mounted thereon. The second frames 12 in this case have the upper abutting surfaces, the installing surfaces, the side surface portions, the lower abutting surfaces, and the connecting portions that are the same as those of the first frames 11a and 11b but are different from the first frames 11a and 11b in that no slit is opened in the side surface portions, no first engaging piece projects from the connecting portions, and no structure corresponding to the gaps 25 of the first frames 11a and 11b is formed of course.

Figure 2:
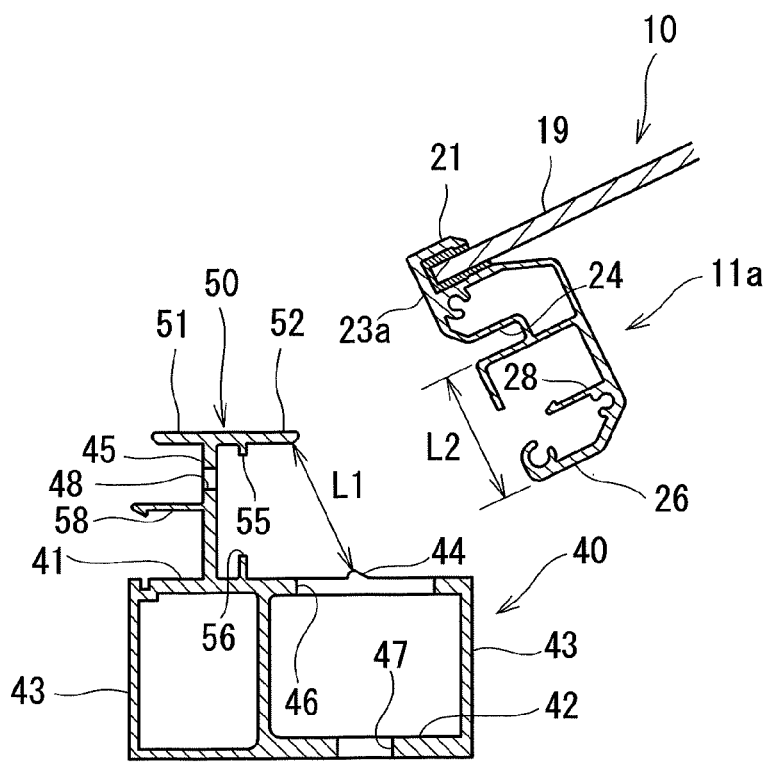
FIG. 2 is a cross-sectional view illustrating a relation between the securing tool in FIG. 1 and a first frame.

As mainly illustrated in FIGS. 1 and 2, each of the securing tool 1 includes a base portion 40 that is secured onto the installation face 5, a standing wall portion 45 that extends upward from an upper surface portion 41 of the base portion 40 and extends in the lengthwise direction of the first frames 11a and 11b, a side extending portion 50 that is formed by a first extending portion 51 and a second extending portion 52 extending from the upper end of the standing wall portion 45 in both directions orthogonal to the lengthwise direction, and a projecting portion 44 that projects from the upper surface portion 41 of the base portion 40 at a position separated from the standing wall portion 45 in the same direction as the second extending portion 52.

To be more specific, the base portion 40 has a rectangular cylindrical shape formed by a pair of side wall portions 43, the upper surface portion 41 connecting the upper ends of the side wall portions 43, and a bottom surface portion 42 connecting the lower ends of the side wall portions 43. The upper surface portion 41 and the bottom surface portion 42 have rectangular shapes the long sides of which are sides at the boundaries between them and the side wall portions 43. The standing wall portion 45 is parallel to the pair of long sides of the upper surface portion 41 and a distance from one of the pair of long sides to the standing wall portion 45 is larger than a distance from the other of the pair of long sides to the standing wall portion 45. In other words, the standing wall portion 45 is located on the base portion 40 so as to deviate in the direction orthogonal to the lengthwise direction.

The first extending portion 51 and the second extending portion 52 have the same height from the upper surface portion 41 and form a T shape together with the standing wall portion 45. Of these two extending portion 51 and 52, the first extending portion 51 extends toward one of the pair of long sides of the upper surface portion 41, which is closer to the standing wall portion 45.

A fastening hole portion 47 is penetratingly provided in the bottom surface portion 42 of the base portion 40 at a position deviating in the direction in which the second extending portion 52 extends. The fastening hole portion 47 has a larger diameter than that of a thread portion of a screw 61 and has a smaller diameter than the head of the screw 61. An operation hole portion 46 having a larger diameter than the head of the screw 61 is penetratingly provided in the upper surface portion 41 of the base portion 40 at a position just above the fastening hole portion 47. The fastening hole portion 47 is provided so as to be separated from the standing wall portion 45 at a position that does not overlap with the end side of the second extending portion 52 when seen from above.

The projecting portion 44 is a projected line parallel to the standing wall portion 45 and passing through the center of the operation hole portion 46, and the height thereof from the upper surface 41 is 1 mm to 5 mm. As illustrated in FIG. 2, a distance L1 between the projecting portion 44 and an end of the second extending portion 52 is set to be larger than a distance L2 between the lower end of an opening end of the slit 24 and the lower abutting surface 26 in the first frame 11$a$ or 11$b$.

The securing tool 1 further includes a second engaging piece 58 projecting in the same direction as the first extending portion 51 from the standing wall portion 45 under the first extending portion 51, and the front end of the second engaging piece 58 has a hook shape bent downward. In addition, the securing tool 1 includes a projecting wall 55 projecting downward from the second extending portion 52 at a position separated from the standing wall portion 45 by several millimeters and a second projecting wall 56 projecting upward from the upper surface portion 41 of the base portion 40 at a position just under the projecting wall 55. The projecting wall 55 and the second projecting wall 56 are surfaces parallel to the standing wall portion 45. A distance from the standing wall portion 45 to the projecting wall 55 (which is equal to a distance from the standing wall portion 45 to the second projecting wall 56) is set to be slightly larger than the height of the head of a small screw 62. The distance from the standing wall portion 45 to the projecting wall 55 is set to be larger than the double of a distance between an extended surface of the side wall upper portion 23$a$ and the side wall intermediate portion 23$b$ by 2 mm to 5 mm.

The securing tool 1 has a small hole portion 48 penetrating through the standing wall portion 45 at a position higher than a position at which the second engaging piece 58 projects. The small hole portion 48 has a larger diameter than that of a thread portion of the small screw 62 and has a smaller diameter than the head of the small screw 62.

Construction of the securing structure in which the solar cell modules 10 are secured onto the installation face 5 using the securing tools 1 having the above-described configuration will be described below. The eaves covers 13 are mounted on eaves-side end sides of the solar cell modules 10, which belong to the most eaves-side row.

Figure 4:
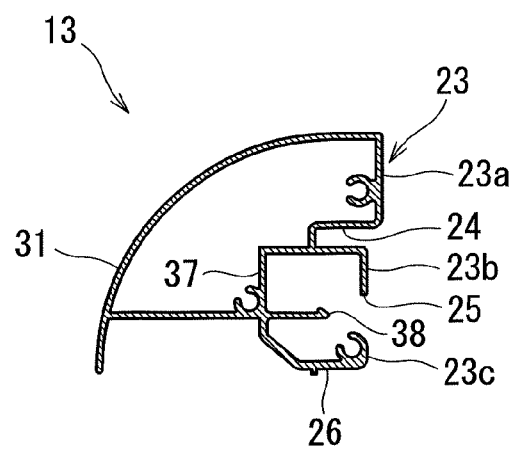
FIG. 4 is a cross-sectional view of an eaves cover.

As mainly illustrated in FIG. 4, a part of the cross-sectional shape of each eaves cover 13 in the direction orthogonal to the lengthwise direction is common to those of the first frames 11$a$ and 11$b$. The common part thereof is the side surface portion 23 (the side surface upper portion 23$a$, the side surface intermediate portion 23$b$, and the side surface lower portion 23$c$), the slit 24, the gap 25, and the lower abutting surface 26. The eaves cover 13 includes a cover portion 31 extending from the upper end of the side surface portion 23 so as to have the same height as the upper abutting surfaces 21 of the first frames 11$a$ and 11$b$, and a cross-sectional shape of the cover portion 31 is a substantially circular arc shape that descends as is farther from the side surface portion 23. The eaves cover 13 has a plurality of portions connecting the cover portion 31 and the slit 24. Among these portions, a longitudinal connecting portion 37 is a portion parallel to the side surface portion 23 and a first engaging piece 38 projects from the longitudinal connecting portion 37. The first engaging piece 38 has the same configuration as that of the first engaging piece 28 of the first frames 11$a$ and 11$b$. The eaves cover 13 is an extruded member made of metal such as aluminum in the same manner as the first frames 11$a$ and 11$b$ and the second frames 12 and has a constant cross-sectional shape orthogonal to the lengthwise direction thereof.

Figure 5A:
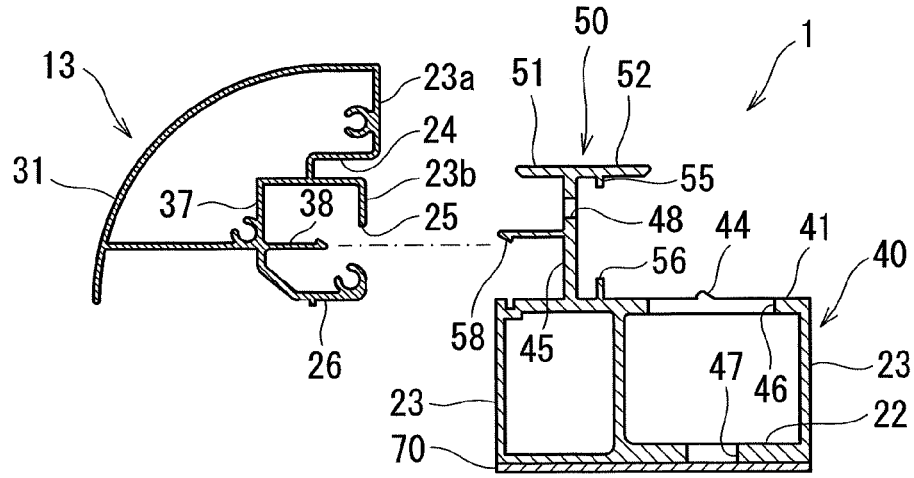
FIGS. 5A to 5C are descriptive views for explaining procedures of securing the eaves cover onto an installation face using the securing tool in FIG. 1.
Figure 5B:
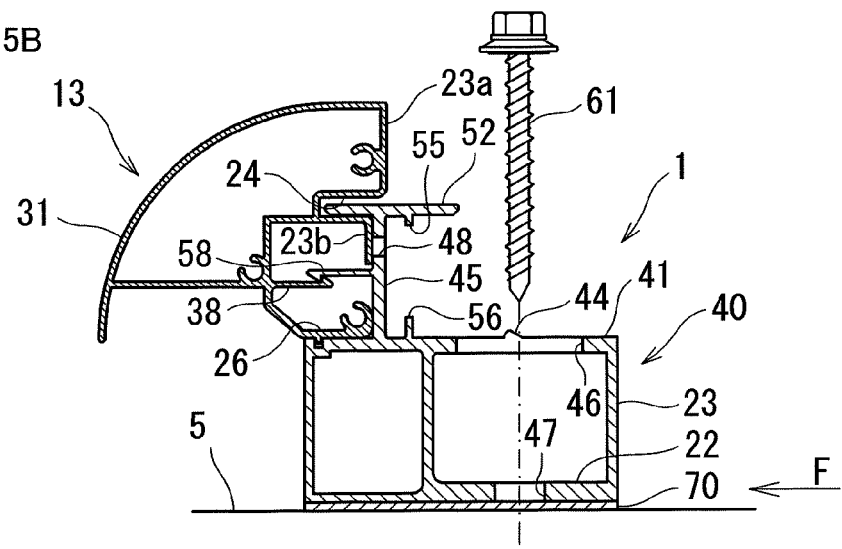
Figure 9:
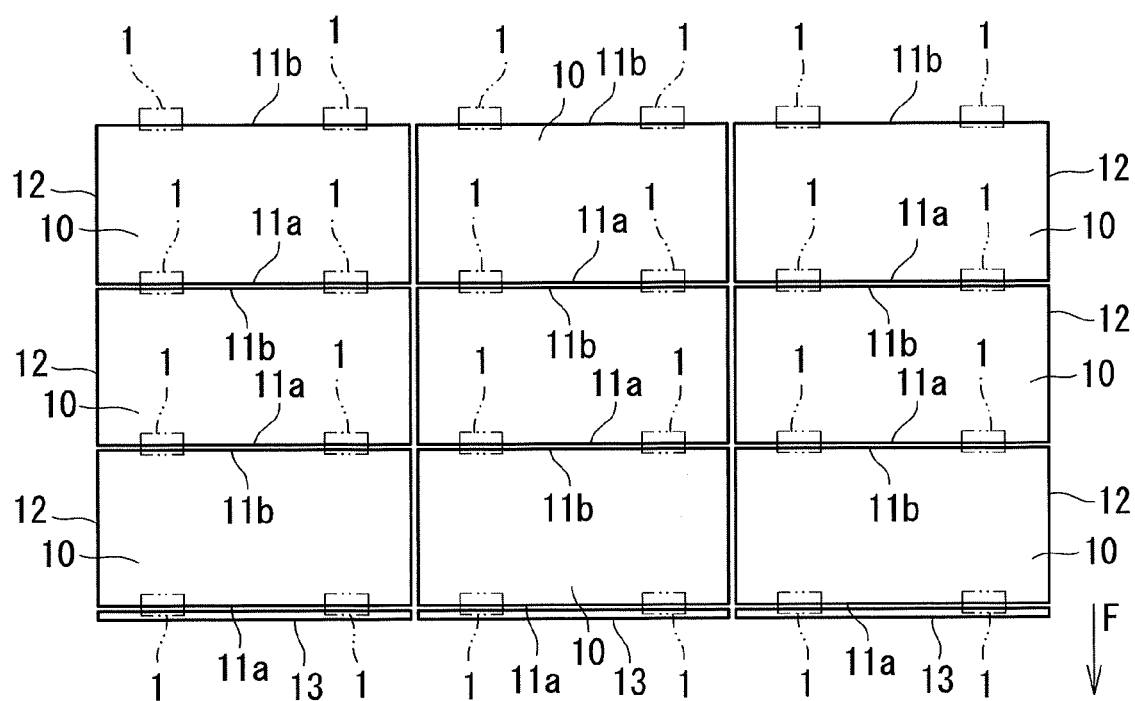
FIG. 9 is a plan view illustrating a relation between a plurality of solar cell modules that are secured onto the installation face and securing tools.

When the above-described eaves cover 13 is mounted on the solar cell module 10 at the most eaves side, first, the first extending portion 51 of the securing tool 1 is inserted into the slit 24 of the eaves cover 13 (see FIG. 5A). The securing tool 1 is made to slide along the slit 24 to a position at which it can support the eaves cover 13 with a good balance and the securing tool 1 can be fastened to a structural member such as balk. For example, as illustrated in FIG. 9, when the two securing tools 1 are mounted on one eaves cover 13, the eaves cover 13 and the eaves-side first frame 11$a$ of one solar cell module 10 are secured onto the installation face 5 with the two securing tools 1 interposed therebetween.

After the securing tool 1 is positioned by sliding along the slit 24, the side surface intermediate portion 23$b$ and the side surface lower portion 23$c$ of the eaves cover 13 are made to abut against the standing wall portion 45 of the securing tool 1 and the lower abutting surface 26 of the eaves cover 13 is installed on the upper surface portion 41 of the securing tool 1. The hook-shaped front end of the first engaging piece 38 of the eaves cover 13 and the hook-shaped front end of the second engaging piece 58 of the securing tool 1 are thereby engaged with each other. In this state, the screw 61 is inserted through the fastening hole portion 47 and is fastened to the installation face 5. The securing tool 1 supporting the eaves cover 13 at the eaves side relative to the standing wall portion 45 is secured onto the installation face 5 (see FIG. 5B). The fastening hole portion 47 is located at the ridge side relative to the end side of the second extending portion 52 without overlapping with the second extending portion 52 when seen from above and the operation hole portion 46 having the larger diameter than the fastening hole portion 47 is provided in the upper surface portion 41 of the base portion 40. Therefore, an operation of fastening the screw 61 using a tool is easily performed. It should be noted that when the securing tool 1 is secured onto the installation face 5, a waterproofing material 70 is interposed between the bottom surface portion 42 of the securing tool 1 and the installation face 5.

Figure 5C:
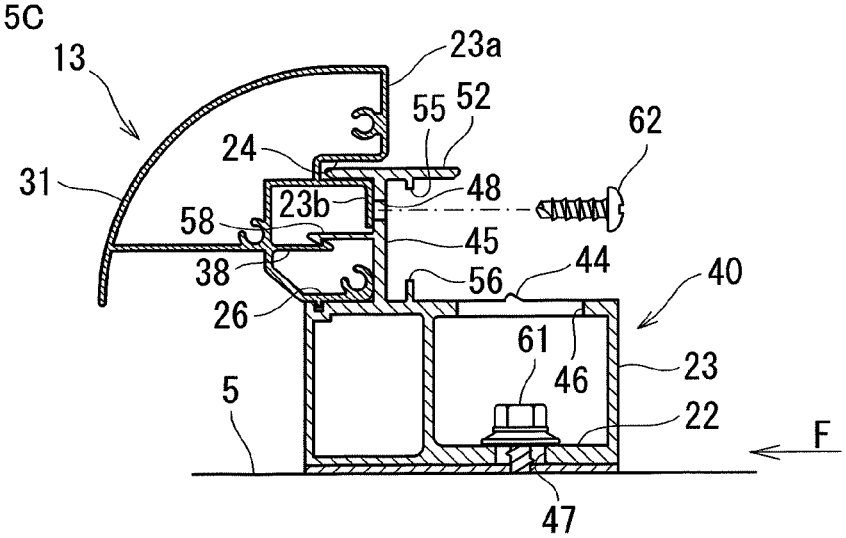
Figure 6D:
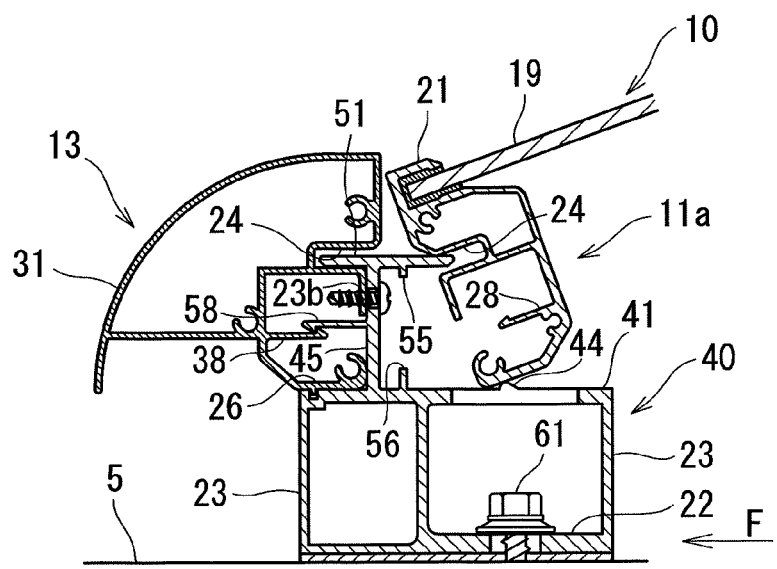
FIGS. 6D to 6F are descriptive views for explaining procedures of securing the solar cell modules onto the installation face using the securing tool in FIG. 1.
Figure 6E:
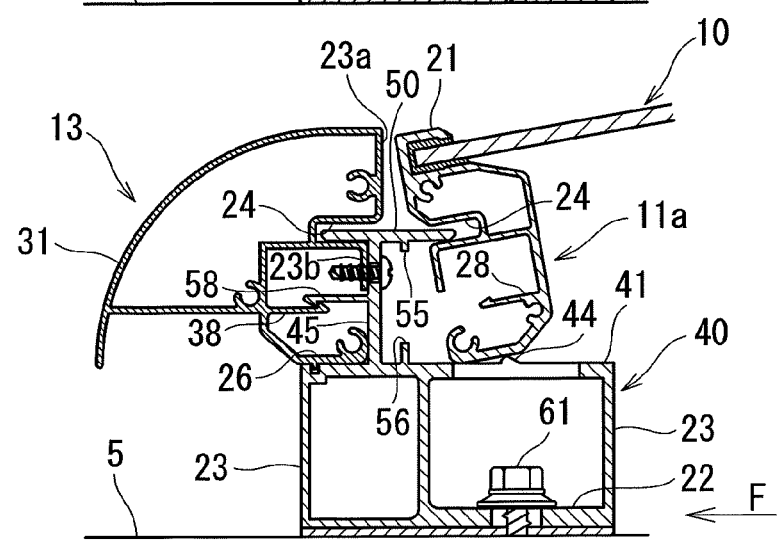
Figure 6F:
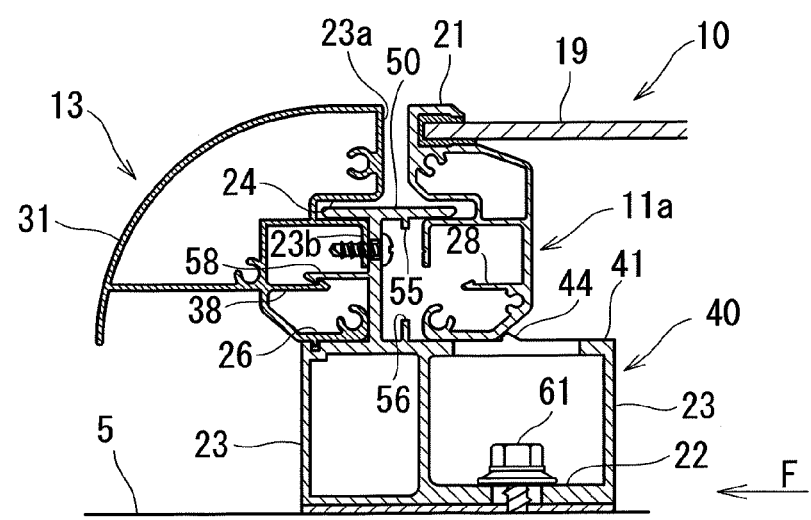

Further, the side surface intermediate portion 23$b$ of the eaves cover 13 and the standing wall portion 45 of the securing tool 1 are fastened with the small screw 62 inserted through the small hole portion 48 (see FIG. 5C). The eaves cover 13 is thereby prevented from sliding in the lengthwise direction relative to the securing tool 1. When the installation face 5 is the inclined face, external force in the direction of separating the eaves cover 13 from the securing tool 1 acts on the eaves cover 13 by its own weight. However, fastening of the securing tool 1 and the eaves cover 13 by the small screw 62 enables the securing tool 1 to support the eaves cover 13 more stably in comparison with the case in which only the engagement between the first engaging piece 38 and the second engaging piece 58 resists the external force.

After the eaves cover 13 is secured with the securing tool 1, the solar cell module 10 is supported at the ridge side of the same securing tool 1 that secures the eaves cover 13. To be specific, the lower abutting surface 26 of the eaves-side first frame 11$a$ of the pair of first frames 11$a$ and 11$b$ of the solar cell module 10 is installed on the upper surface portion 41 of the securing tool 1 while the second extending portion 52 of the securing tool 1 is inserted into the slit 24 of the first frame 11$a$. The projecting portion 44 projects from the upper surface portion 41 of the securing tool 1 at the same side as the second extending portion 52 but the distance L1 is set to be larger than the distance L2 as described above (see FIG. 2). Therefore, the second extending portion 52 can be inserted into the slit 24 by inclining the solar cell module 10 so as to be higher toward the ridge (see FIGS. 6D and 6E). Then, a lower portion of the first frame 11a relative to the lower end of the opening edge of the slit 24 can be located in a space under the second extending portion 52 and the entire surface of the lower abutting surface 26 can be made to abut against the upper surface portion 41 (see FIG. 6F).

Figure 7G:
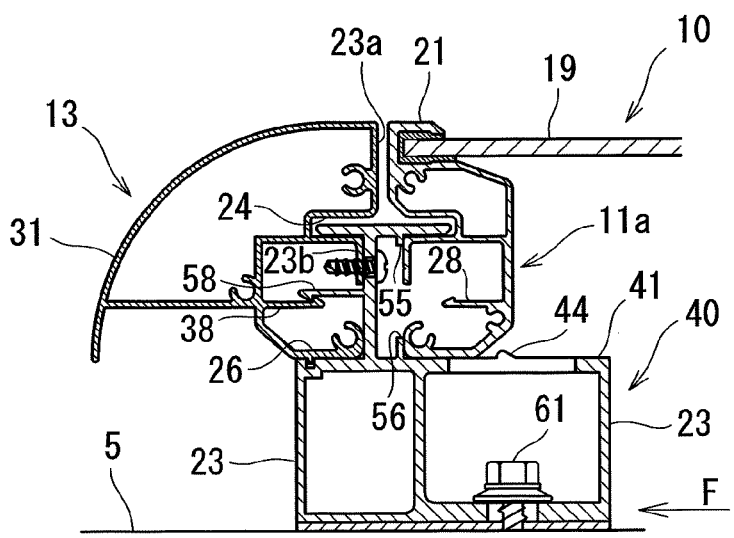
FIGS. 7G to 7I are descriptive views for explaining procedures of securing the solar cell modules onto the installation face using the securing tool in FIG. 1 subsequently to FIGS. 6D to 6F.
Figure 7H:
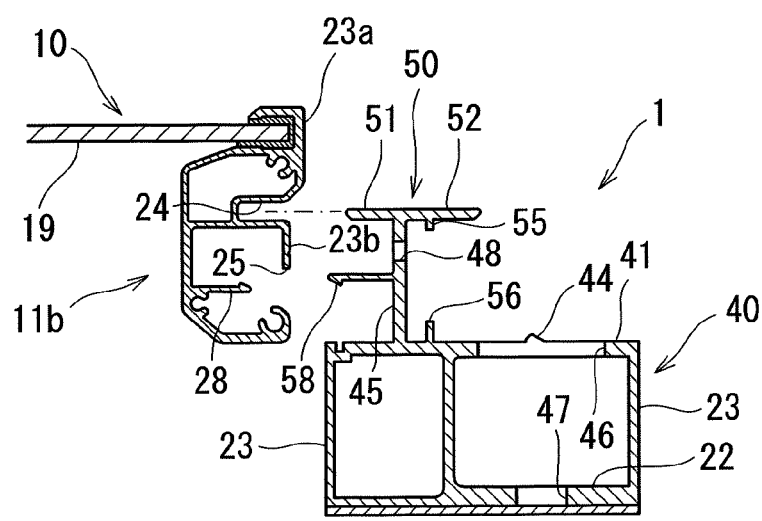
Figure 7I:
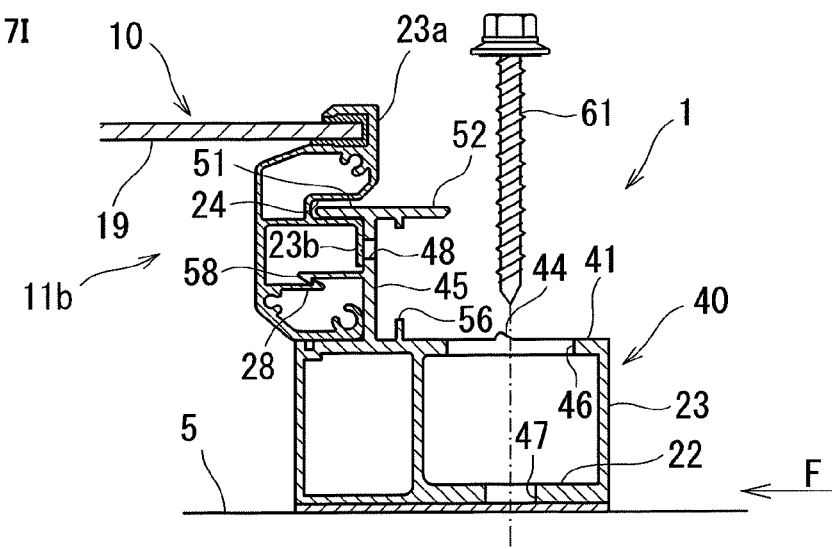
Figure 8J:
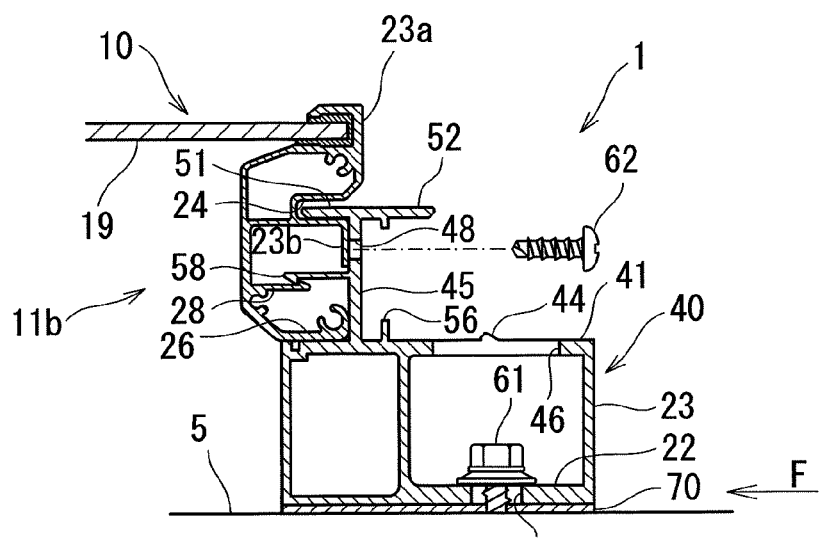
FIGS. 8J and 8K are descriptive views for explaining procedures of securing the solar cell modules onto the installation face using the securing tool in FIG. 1 subsequently to FIGS. 7G to 7I and FIG. 8L is a cross-sectional view of a constructed securing structure.
Figure 8K:
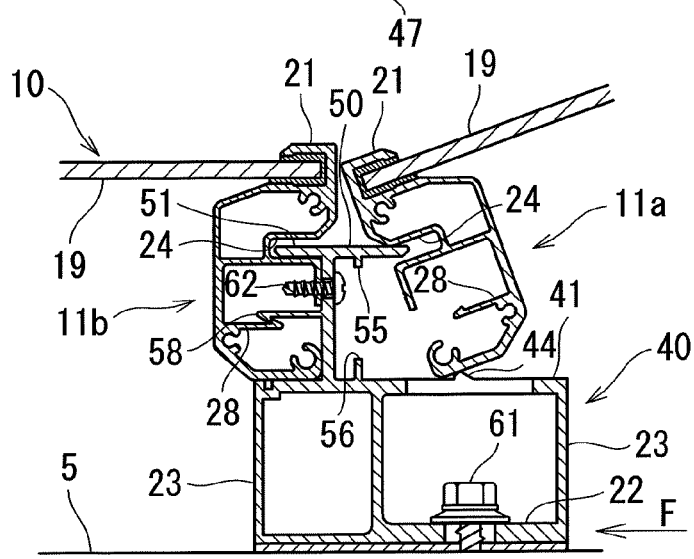
Figure 8L:
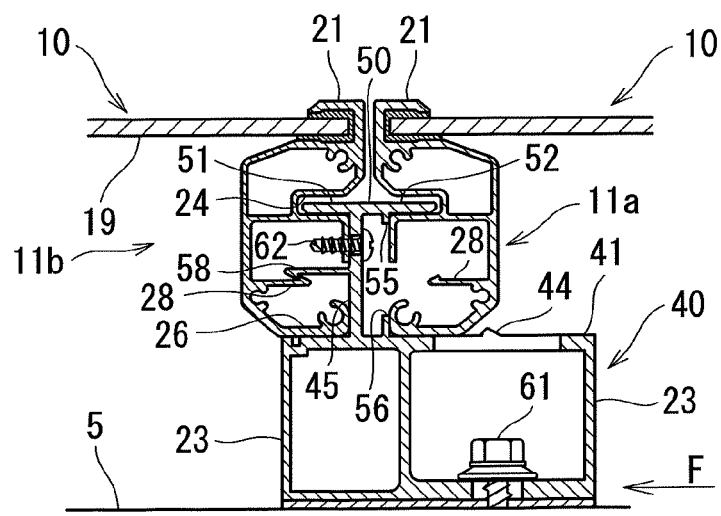

At this time, a state in which the side surface intermediate portion 23b and the side surface lower portion 23c of the eaves-side first frame 11a abut against the projecting wall 55 and the second projecting wall 56 of the securing tool 1 corresponds to a state in which the first frame 11a is the closest to the eaves cover 13 (see FIG. 7G). That is to say, a space for the head of the small screw 62 is ensured between the standing wall portion 45 and the projecting wall 55. In addition, as described above, the distance from the standing wall portion 45 to the projecting wall 55 is set to be larger than the double of the distance between the extended surface of the side wall upper portion 23a and the side wall intermediate portion 23b. Therefore, a gap is formed between the first frame 11a and the eaves cover 13 in the state in which the first frame 11a is the closest to the eaves cover 13. With this gap, even when the first frame 11a and the eaves cover 13 made of metal thermally expand with change in temperature, or the like, contact therebetween is suppressed. Further, the gap prevents load of the solar cell module 10 from acting on the eaves cover 13 even when the installation face 5 is inclined.

After the eaves-side first frame 11a is secured, the ridge-side first frame 11b of the same solar cell module 10 is then secured. For securing it, the first extending portion 51 of the new securing tool 1 is inserted into the slit 24 of the ridge-side first frame 11b (see FIG. 7H) and the securing tool 1 is made to slide along the slit 24 to a position appropriate for securing. As illustrated in FIG. 9, in the same manner as the case of the eaves cover 13, when the two securing tools 1 are mounted on one first frame 11b, the ridge-side first frame 11b of the one solar cell module 10 and the eaves-side first frame 11a of the adjacent solar cell module 10 are secured onto the installation face 5 using the two securing tools 1 arranged therebetween.

At the stage described above with reference to FIG. 6D, that is, at the stage at which the eaves-side first frame 11a is supported on the securing tool 1, the other securing tool 1 may be mounted on the ridge-side first frame 11b of the same solar cell module 10 in a sliding manner.

After the securing tool 1 is positioned on the ridge-side first frame 11b, the side surface intermediate portion 23b and the side surface lower portion 23c of the first frame 11b are made to abut against the standing wall portion 45 of the securing tool 1 and the lower abutting surface 26 of the first frame 11b is installed on the upper surface portion 41 of the securing tool 1. The first engaging piece 28 of the first frame 11b and the second engaging piece 58 of the securing tool 1 are thereby engaged with each other. In this state, the screw 61 is inserted through the fastening hole portion 47 and fastened to the installation face 5 (see FIG. 7I), and the side surface intermediate portion 23b of the first frame 11b and the standing wall portion 45 of the securing tool 1 are fastened with the small screw 62 (see FIG. 8J).

The securing tool 1 supporting the ridge-side first frame 11b of the solar cell module 10 on a first row at the eaves side relative to the standing wall portion 45 is made into a state of being secured onto the installation face 5. Subsequently, the eaves-side first frame 11a of the solar cell module 10 in a subsequent row (second row) is supported at the ridge side of the same securing tool 1 (see FIG. 8K). In this case, as described above with reference to FIGS. 6D and 6E, the solar cell module 10 is inclined so as to be higher toward the ridge. Thereafter, the same operations as those described above are repeated, so that the solar cell modules 10 can be mounted in order in one direction toward the ridge from the eaves and the securing structure having the following configuration is formed. That is to say, the securing structure having the configuration in which the first extending portion 51 of one securing tool 1 is inserted into the slit 24 of the ridge-side first frame 11b of one of the adjacent solar cell modules 10, the second extending portion 52 of the same securing tool 1 is inserted into the slit 24 of the eaves-side first frame 11a of the other of the solar cell modules 10, the lower abutting surface 26 of the ridge-side first frame 11b abuts against the upper surface portion 41 of the base portion 40 at the eaves side relative to the standing wall portion 45, the lower abutting surface 26 of the eaves-side first frame 11a abuts against the upper surface portion 41 of the base portion 40 at the ridge side relative to the standing wall portion 45, and the first engaging piece 28 of the ridge-side first frame 11b is engaged with the second engaging piece 58 of the securing tool 1 (see FIG. 8L).

With this securing structure, the entire surface of the lower abutting surface 26 of the eaves-side first frame 11a abuts against the upper surface portion 41 and the projecting portion 44 projects from the upper surface portion 41 at the inner side relative to the lower abutting surface 26. Accordingly, the eaves-side first frame 11a in the state of being installed on the upper surface portion 41 of the securing tool 1 can slide in the lengthwise direction but movement thereof in the direction orthogonal to the lengthwise direction is limited by the projecting portion 44. In addition, at least a part of the second extending portion 52 is inserted into the slit 24 of the first frame 11a in the state in which the entire surface of the lower abutting surface 26 abuts against the upper surface portion 41 and the projecting portion 44 projects from the upper surface portion 41 at the inner side relative to the lower abutting surface 26. Therefore, even when upward force acts on the first frame 11a in the state of being installed on the upper surface portion 41 of the securing tool 1, the slit 24 and the second extending portion 52 interfere with each other to inhibit the upward movement of the first frame 11a.

That is to say, with this securing structure, both of the movement of the first frame 11a in the direction orthogonal to the lengthwise direction and the upward movement thereof are prevented, in the state in which the first frame 11a is installed on the upper surface portion 41 of the securing tool 1. Accordingly, when the solar cell modules 10 are secured onto the installation face 5 using the securing tools 1 in order in one direction toward the ridge from the eaves, relative detachment of the securing tools 1 from the slits 24 of the first frames 11a due to undesired movement of the solar cell modules 10 can be effectively prevented by the projecting portions 44. The securing structure can therefore be constructed with high workability.

The projecting portion 44 projects from the upper surface portion 41 of the securing tool 1 but the distance L1 between the projecting portion 44 and the end of the second extending portion 52 is set to be larger than the distance L2 between the lower end of the opening edge of the slit 24 and the lower abutting surface 26. Therefore, when the solar cell module 10 is intentionally inclined so as to be higher toward the ridge, the first frame 11a can be supported on the securing tool 1 while the second extending portion 52 of the securing tool 1 is inserted into the slit 24 of the first frame 11*a* and the lower abutting portion 26 of the first frame 11*a* is installed on the upper surface portion 41 of the securing tool 1.

In addition, the distance from the standing wall portion 45 to the projecting wall 55 in the securing tool 1 is set to be larger than the double of the distance between the extended surface of the side surface upper portion 23*a* and the side surface intermediate portion 23*b* in each of the first frames 11*a* and 11*b*. Therefore, the gap is formed between the first frames 11*a* and 11*b* in the state in which the first frame 11*b* of one of the adjacent solar cell modules 10 and the first frame 11*a* of the other of the solar cell modules 10 are the closest to each other. With this gap, even when the first frames 11*a* and 11*b* made of metal thermally expand with change in temperature, contact therebetween is suppressed. Further, this gap prevents load of the solar cell module 10 at the upper row from acting on the solar cell module 10 at the lower row even when the installation face 5 is inclined.

Although the present invention has been described above using the preferred embodiment, the present invention is not limited by the above-described embodiment and various improvements and changes in design can be made in a range without departing from the subject matter of the present invention as will be described below.

For example, in the above-described embodiment, the eaves cover 13 is supported at the eaves side of the securing tool 1 arranged at the most eaves side and the eaves-side first frame 11*a* of the solar cell module 10 is supported at the ridge side of the securing tool 1, as the example. The invention is not limited thereto and only the eaves-side first frame 11*a* of the solar cell module 10 may be supported on the securing tool 1 arranged at the most eaves side without using the eaves cover 13. In this case, the securing tool 1 is made to slide along the slit 24 to be positioned in the state in which the second extending portion 52 of the securing tool 1 is inserted into the slit 24 of the eaves-side first frame 11*a*.

In the above-described embodiment, in the first frames 11*a* and 11*b*, the entire surfaces of the side surface portions 23 are not located on the same planes and the side surface intermediate portions 23*b* and the side surface lower portions 23*c* on the same planes are located at the inner side relative to the side surface upper portions 23*a*, as the example. However, the invention is not limited thereto, and the entire side surface portions 23 of the first frames 11*a* and 11*b* may be located on the same planes. In this case, a gap corresponding to the distance between the standing wall portion 45 and the projecting wall 55 of the securing tool 1 is formed between the first frames 11*a* and 11*b* of the adjacent solar cell modules 10.

What is claimed is:

1. A solar cell module securing structure in which solar cell modules each formed by holding a pair of opposing sides of a solar cell panel using one pair of first frames, the first frames of an adjacent pair of the solar cell modules being secured onto an installation face using a singular securing tool, wherein
    each of the first frames includes:
        an upper abutting surface that abuts against an upper surface of the solar cell panel;
        a side surface portion that extends downward from one end of the upper abutting surface at a right angle;
        an installing surface that extends in parallel to the upper abutting surface from an intermediate height of the side surface portion and holds the solar cell panel between the installing surface and the upper abutting surface while the solar cell panel is installed on the installing surface;
        a slit that is opened in the side surface portion at an intermediate height thereof and extends in a lengthwise direction of the first frame under the installing surface; and
        a lower abutting surface having a lower abutting surface length that extends in parallel to the upper abutting surface from a lower end of the side surface portion,
    the securing tool includes:
        a base portion having an upper surface portion and a bottom surface portion that is secured onto the installation face;
        a fastening hole portion that is penetratingly provided in the bottom surface portion of the base portion;
        an operation hole portion that has a center and is penetratingly provided in the upper surface portion of the base portion at a position just above the fastening hole portion;
        a standing wall portion that extends upward from the upper surface portion of the base portion and extends in a lengthwise direction of the first frame;
        a side extending portion that is formed by a first extending portion and a second extending portion having a second extended portion length extending from an upper end of the standing wall portion in both directions orthogonal to the lengthwise direction; and
        a projecting portion is a projected line that projects from the upper surface portion of the base portion located at a projecting portion length from the standing wall portion in the same direction as the second extending portion and passing through the center of the operation hole portion,
    wherein the lower abutting surfaces of the solar cell modules, which are adjacent to each other, are installed on the upper surface portion of one securing tool in a state in which the first extending portion of the same securing tool is inserted into the slit of one of the adjacent solar cell modules and the second extending portion of the same securing tool is inserted into the slit of the other of the adjacent solar cell modules,
    a distance between the projecting portion and an end of the second extending portion is larger than a distance between a lower end of an opening edge of the slit and the lower abutting surface, the lower abutting surface length is longer than the projecting portion length minus the second extended portion length, and
    at least a part of the second extending portion is inserted into the slit in a state in which the projecting portion projects from the upper surface portion at an inner side relative to the lower abutting surface of which an entire surface abuts against the upper surface portion.

2. The solar cell module securing structure according to claim 1, wherein
    each of the first frames has a connecting portion that connects the lower abutting surface and the installing surface at an inner side relative to the side surface portion, a first engaging piece that projects outward from the connecting portion under the slit, and a gap that is formed in the side surface portion and allows access from outward to the first engaging piece, the securing tool has a second engaging piece that projects in the same direction as the first extending portion from the standing wall portion under the first extending portion, and the first engaging piece is engaged with the second engaging piece in a state in which the first extending portion is inserted into the slit.

* * * * *